(12) United States Patent
Pharand et al.

(10) Patent No.: US 6,727,509 B2
(45) Date of Patent: Apr. 27, 2004

(54) WAFER PEDESTAL TILT MECHANISM

(76) Inventors: Michel Pharand, 17 Belmont Dr., Chelmsford, MA (US) 01824; Allan D. Weed, 299 W. Shore Dr., Marblehead, MA (US) 01945

(*) Notice: Subject to any disclaimer, the term of this patent is extended or adjusted under 35 U.S.C. 154(b) by 0 days.

(21) Appl. No.: 10/023,516

(22) Filed: Dec. 17, 2001

(65) Prior Publication Data
US 2003/0111617 A1 Jun. 19, 2003

(51) Int. Cl.$^7$ .............................. A61N 5/00; G21G 5/00
(52) U.S. Cl. .............................. 250/492.2; 250/454.11
(58) Field of Search ...................................... 250/492.2

(56) References Cited

U.S. PATENT DOCUMENTS 4,899,059 A * 2/1990 Freytsis et al. .......... 250/492.2

* cited by examiner

Primary Examiner—John R. Lee
Assistant Examiner—Erin-Michael Gill
(74) Attorney, Agent, or Firm—J. A. Kastelic; D. Robitaille

(57) ABSTRACT

The invention provides a wafer pad assembly and actuation system for use in an ion implanter, preferably a batch-type ion implanter. The wafer pad assembly includes a rotatable wafer support pad having an upper surface for mounting the wafer, and a lower surface rotationally mounted to a housing of the wafer pad assembly. The lower surface of the wafer support pad further comprises a flange connected to a rotatable shaft. The shaft is connected to an actuator for selectively indexing the shaft so that the wafer support pad is rotationally indexed about its geometric center. The lower surface of the wafer support pad is also connected to a frame having an outer curved surface rotatably mounted within a mating bearing surface of a housing. The curved frame is connected to a plurality of linkages for moving the wafer support pad within the curved frame so that the wafer is pivotable or tiltable about its geometric center.

13 Claims, 7 Drawing Sheets

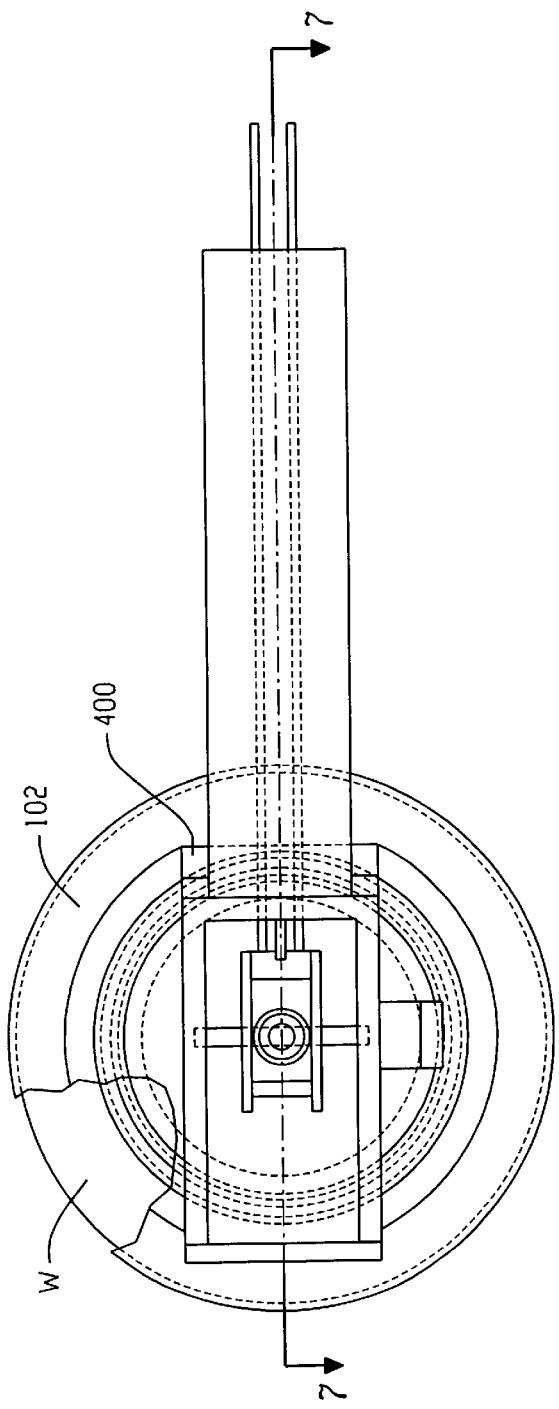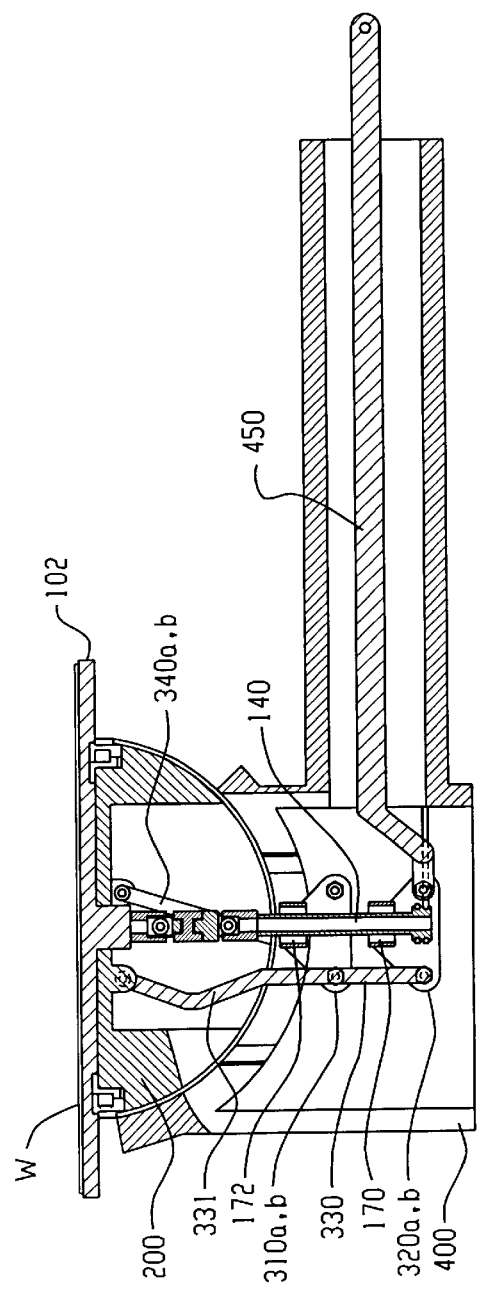

WAFER PEDESTAL TILT MECHANISM

FIELD OF THE INVENTION

The invention relates generally to ion implanters for the manufacture of semiconductor wafers, and more particularly to a mechanism for tilting and twisting wafer support pedestals in batch-type ion implanters.

BACKGROUND OF THE INVENTION

Ion implanters are used to introduce conductivity-altering impurities into semiconductor wafers. In order to accomplish this, the desired impurity material is ionized via an ion source, and then accelerated to form an ion beam of prescribed energy. The ion beam is then directed at the surface of the semiconductor wafer so that the ions in the beam penetrate the semiconductor material and are embedded in the crystalline lattice thereby forming a region of desired conductivity.

In semiconductor wafer manufacturing, there are several important considerations in achieving an effective ion implanter. One important factor is throughput, or the number of wafers processed per time unit. In addition, wafer transfer time, ion implant time and down time are other important considerations. Another important factor is the ability to implant at high angle tilt. A high tilt angle, generally in the range of about 20 to about 35 degrees, allows doping of the silicon structure beneath an obstruction to the beam. Because some electronic devices are oriented in an orthogonal relationship with respect to each other on a wafer, high tilt doping must be performed in each of four quadrants. Thus it is further desirable to be able to rotate or twist the wafer about a longitudinal axis passing through its center.

Commercial ion implanters generally comprise two different types of machines: serial and batch. In serial systems, wafers are processed one at a time. Typical batch ion implanters utilize a rotating disk, upon which wafers to be processed are mounted on pedestals located about the periphery of the disk. While modern serial implant systems provide for high tilt angle implantation and wafer rotation, serial systems that employ beam scanning have a major disadvantage of dose uniformity as compared to batch systems that employ mechanical scanning systems. In addition, because batch systems implant an entire batch of wafers in a single implant process, the heat generated by the ion beam is distributed among the wafers in the batch, making wafer cooling easier to manage. While batch systems have the advantage of high throughput of wafers, one major disadvantage of prior art batch systems is that they do not provide for high tilt angle implantation, nor do they provide for wafer rotation while the wafer remains on the disk. Furthermore, the centrifugal load caused by the wafers positioned about the periphery of the spinning disk greatly increases the mechanical complexity of the system.

Thus, a batch implant system capable of high wafer throughput, uniform dose, and provided with the capability of high tilt angle implantation and wafer rotation is desired.

SUMMARY OF THE INVENTION

The invention provides in one aspect a wafer pad assembly disposed within an ion implanter, and upon which a wafer may be mounted and rotated or indexed. The wafer pad assembly includes a wafer support pad having an upper surface for mounting the wafer and a lower surface. The lower surface is rotationally mounted to a frame of the wafer pad assembly. The lower surface of the wafer support pad further comprises a flange rotationally connected to a shaft; the shaft being connected to an actuator for selectively indexing the shaft wherein the wafer support pad is rotationally indexed.

The invention provides in another aspect a wafer pad assembly disposed within an ion implanter, and upon which a wafer may be mounted and tilted. The wafer pad assembly includes a wafer support pad having an upper surface for mounting the wafer and a lower surface, the lower surface being fixedly connected to an inner surface of a curved frame. The curved frame further comprises an outer curved surface being rotatably mounted within a corresponding mating bearing surface of a housing. The curved frame is connected to a plurality of linkages for rotating the wafer support pad within the curved frame.

These and other aspects and advantages of the present invention will be readily understood and appreciated by those skilled in the art from the following detailed description of the preferred embodiments with the best mode contemplated for practicing the invention in view of the accompanying drawings.

BRIEF DESCRIPTION OF THE FIGURES

FIG. 6 is a rear cutaway view of the wafer pad assembly; and

FIG. 7 is a sectional side view taken in the direction along the line 7—7 shown in FIG. 6.

DETAILED DESCRIPTION OF THE INVENTION

Figure 1:
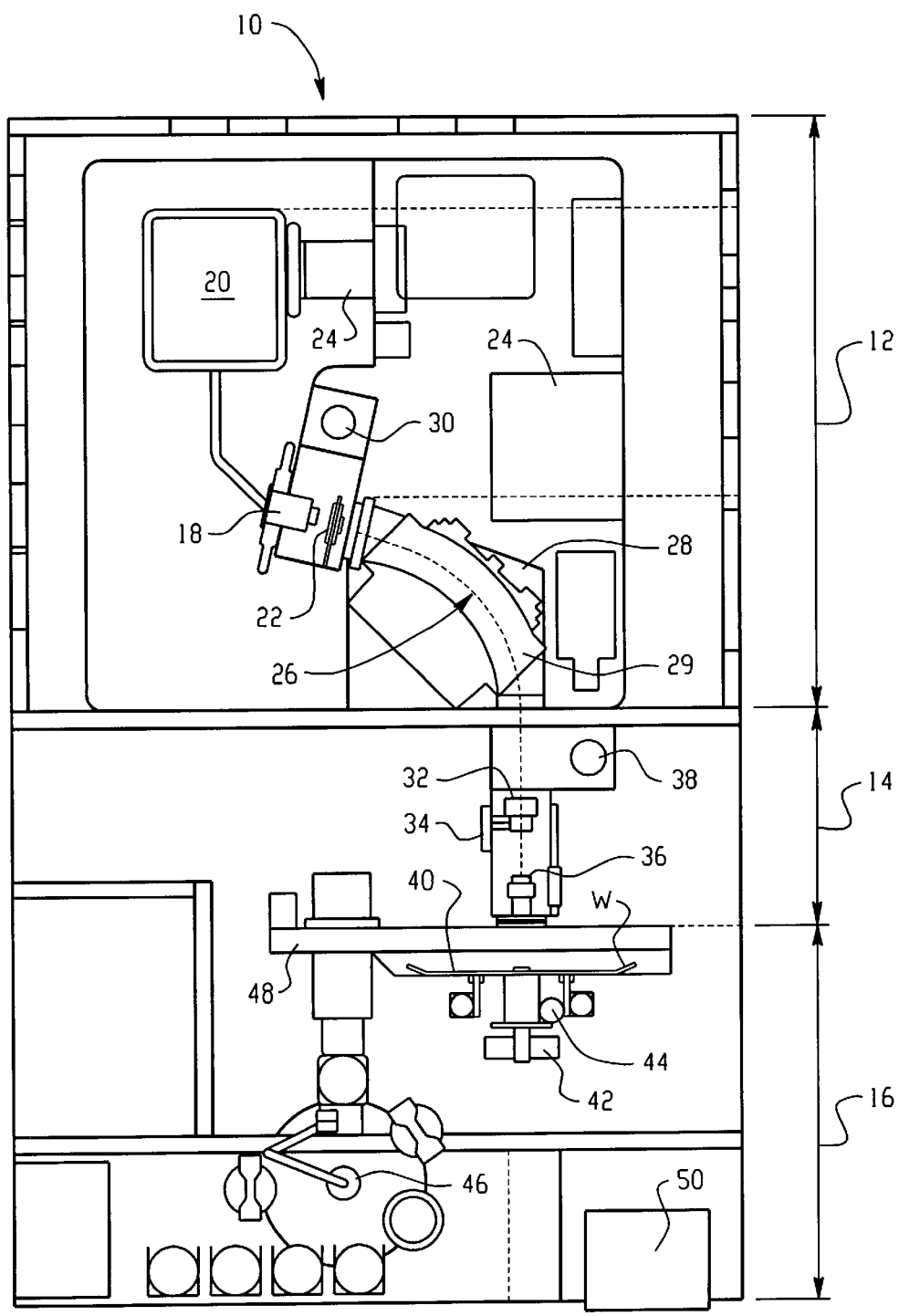
FIG. 1 is a plan view of an ion implantation system into which may be incorporated a wafer pad assembly of the present invention.

Referring now to the drawings, FIG. 1 discloses an ion implanter, generally designated at 10, which comprises a terminal 12, a beamline assembly 14, and an end station 16. Generally, the terminal 12 outputs an ion beam, and the beamline assembly 14 adjusts the focus and energy level of the ion beam and directs it toward a wafer W positioned at the end station 16.

The terminal 12 includes an ion source 18 having a chamber in which dopant gas from a gas box 20 is injected. Energy is imparted to the ionizable dopant gas to generate positive ions within the source chamber. An extraction electrode 22 powered by high voltage supply 24 extracts a beam 26 of positive ions from the source chamber and accelerates the extracted ions toward a mass analysis magnet 28. The mass analysis magnet 28 functions to pass only ions of an appropriate charge-to-mass ratio on to the beamline assembly 14. Evacuation of the beam path 29 provided by the mass analysis magnet 28 is provided by vacuum pump 30.

The beamline assembly 14 comprises a quadrature lens 32, a flag Faraday 34, an electron shower 36, and optionally an ion beam acceleration\deceleration electrode (not shown). The quadrature lens 32 focuses the ion beam output by the terminal 12 and the flag Faraday 34 measures ion beam characteristics during system setup. The optional acceleration\deceleration electrode may be used to accelerate or decelerate the focused ion beam to a desired energy level prior to implantation into a wafer at the end station 16. Evacuation of the beam path provided by the beamline assembly 14 is provided by one or more vacuum pumps 38.

The end station 16 includes a wafer platform such as a rotatable disk 40 upon which a plurality of wafers W are mounted. A rotary disk drive mechanism 42 is provided for imparting rotational motion to the disk, and a linear drive mechanism 44 is also provided for imparting linear motion to the disk. A robotic arm 46 loads wafers W onto the disk 40 via a load lock chamber 48. Operation of the system is controlled by an operator control station 50 located at the end of the end station 16.

Figure 2:
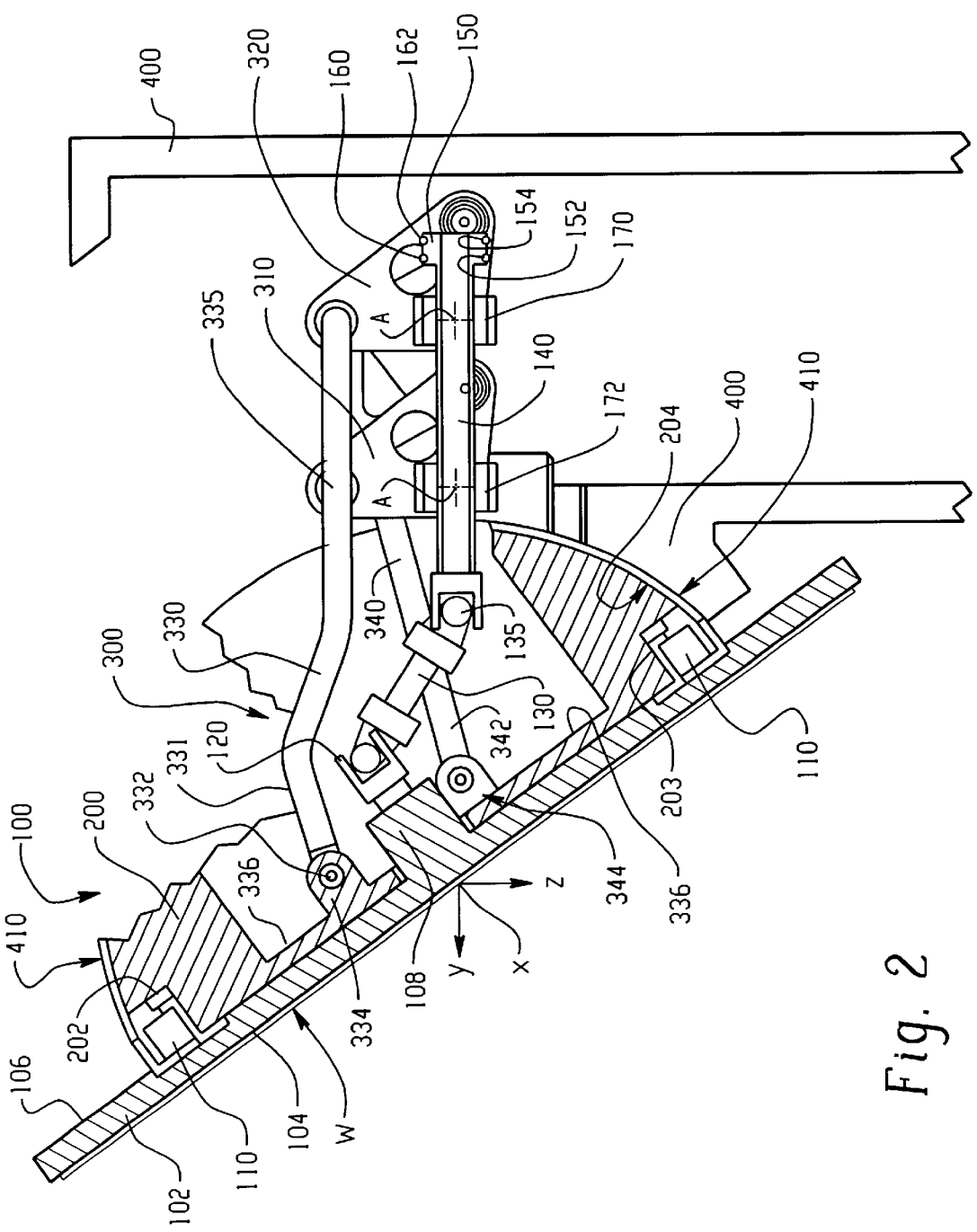
FIG. 2 is a cutaway sectional side view of a wafer pad assembly of the present invention, wherein the wafer pad is shown in a tilted position.

The pedestals on the rotating disk 40, upon which the wafers are mounted, each include a wafer pad assembly 100 constructed according to the present invention, as shown in FIG. 2. The wafer pad assembly 100 provides for both (i) high angle tilting of the wafers W mounted thereon, in the range of about zero to about 35 degrees, and (ii) indexed rotation (i.e., twisting) of each individual wafer W. Tilting is defined as the rotation of the wafer W about the X axis of the x,y,z coordinate system, which in any tilted or untilted position passes through the center of the wafer and lies within the plane of the wafer, as shown in shown in FIG. 2. Indexed rotation (i.e., twisting) is defined as the rotation of the wafer W at its center about the Y-axis in the X-Z plane (in the untilted position shown in FIG. 4).

The wafer pad assembly 100 includes a wafer support pad 102, a wafer pad hemispherical frame 200 shaped to allow tilt motion of the wafer support pad 102, and a tilt/twist linkage system 300 for providing the tilt and the twist actuation of the wafer support pad 102. Each wafer W is mounted upon and clamped to a wafer support pad 102 via one or more conventional clamps (not shown) or other means known to those skilled in the art. The wafer support pad 102 is rotatably mounted to the hemispherical frame 200, such that it can rotate about the Y-axis while the frame 200 remains in a fixed position.

The wafer support pad 102 comprises a substantially flat circular plate which has an upper flat surface 104 for mounting a wafer W thereon. The wafer support pad further comprises a lower surface 106 which has a central mounting flange 108 for connecting to the tilt/twist linkage system 300 as described in more detail below. The wafer support pad 102 further comprises a circumferential bearing 110 mounted upon the lower surface 106. The circumferential bearing is received in an angular bearing 202 sealed from vacuum (not shown) for allowing the circumferential bearing 110, and thus the entire wafer support pad 102, to rotate about the Y-axis independently of the hemispherical frame 200. The angular bearing 202 is mounted upon the hemispherical frame 200 as described in more detail below.

In order to facilitate the twist (indexing) action of the wafer support pad 102 about the Y-axis, the central flange 108 is connected at a first end to a first universal joint 120. The universal joint 120 is connected to a telescopic splined shaft 130 which may increase or decrease in length due to the tilting motion of the wafer support pad 102. The telescopic splined shaft 130 is connected at a second end to a second universal joint 135. The second universal joint 135 is connected to an intermediate shaft 140 which has a distal end having a pulley 150 mounted thereon.

The pulley 150 has a first and second set of grooves 152 and 154 for receiving, respectively, a push cable 160 and a pull cable 162. The cables 160, 162 are connected directly to a central indexing ring or hub (not shown) located at the center of the disk 40. Discrete rotation of the hub causes corresponding discrete actuation of cables 160,162 in opposite directions to rotate pulley 150. Rotation of pulley 150 rotates shafts 135 and 140, which in turn rotate the wafer pad support 102 in discrete angular increments. Indexed rotations of 90, 180 and 270 degrees (for quadrant implants), or other desired angular positions can be obtained.

Figure 5:
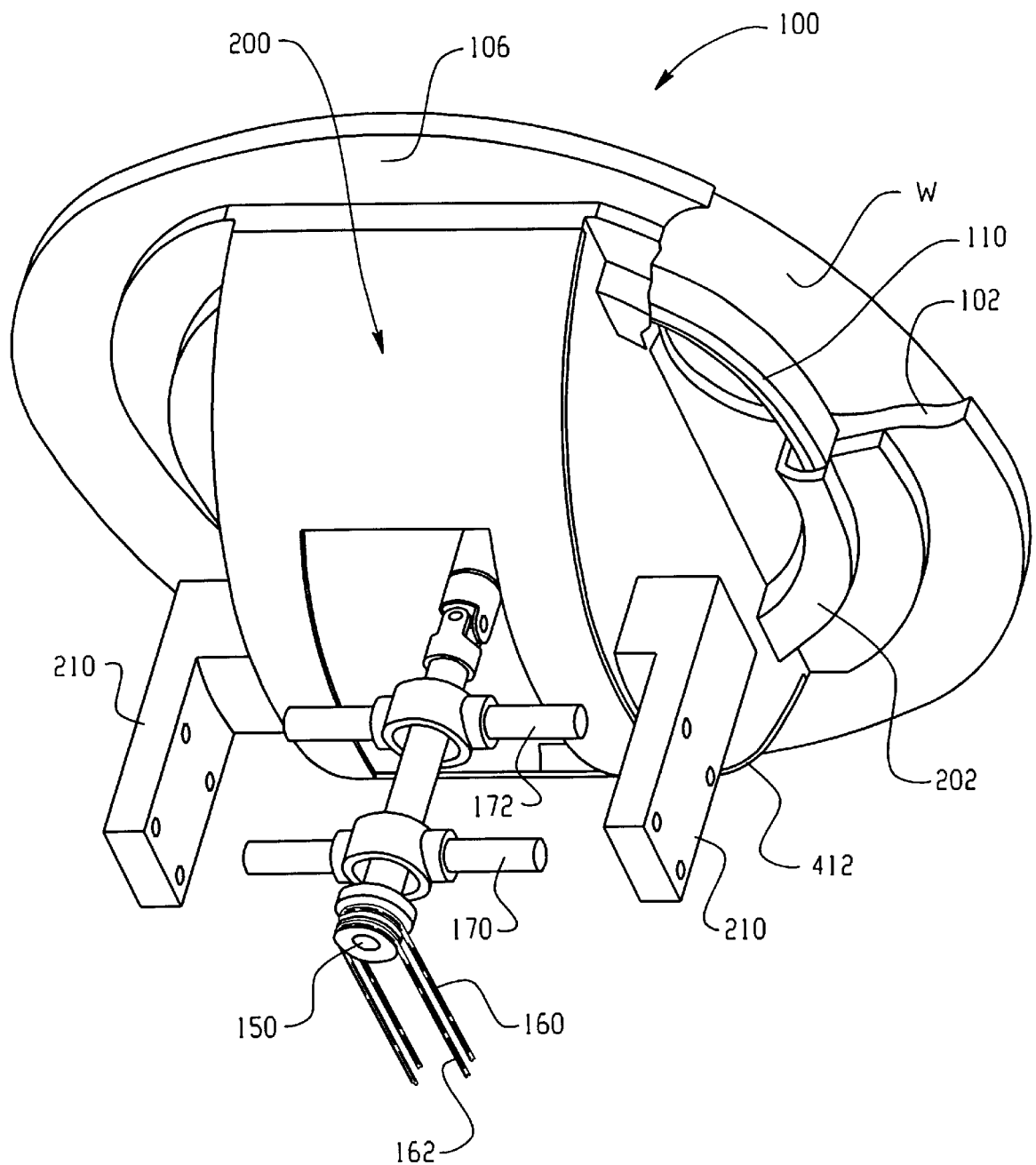
FIG. 5 is a rear perspective view of the wafer pad assembly shown without the housing and the tilt mechanisms, showing the indexing mechanism in greater detail.

It is important to note that the wafer support pad 120 may be twisted (indexed) in any tilted or untilted position. In any position, the portion of the tilt/twist linkage system 300 responsible for twist actuation is capable of transmitting torque from the cables 160, 162 through pulley 150 and shafts 135, 140, and through the universal joints 120, 135 to the wafer support pad 102. First and second shaft support bearings 170 and 172 provide support the intermediate shaft 140 (also see FIG. 5).

The wafer pad assembly 100 further provides for high tilt angular implantation of each of the individual wafers W about its respective geometric center. The wafer pad assembly 100 is capable of providing for high tilt of the wafer pad in the range of about 0 to about +/−35 degrees about the wafer X-axis. In order to accomplish the tilting motion, the wafer support pad 102 is mounted to the hemispherical frame 200. The hemispherical frame 200 has an inner surface 203 connected to the angular bearing 202 and an outer convex-shaped surface 204 which is rotatably mounted within a mating concave-shaped surface 410 of a housing 400. The outer convex surface 204 of the frame 200 is in sliding engagement with the concave surface 410 of the housing. Wear plates are attached to the mating surfaces 204, 410, comprising a material having a low coefficient of friction such as diamond-like carbon ("DLC"). Diamond-like carbon provides a nearly frictionless, smooth slidable surface.

Figure 3A:
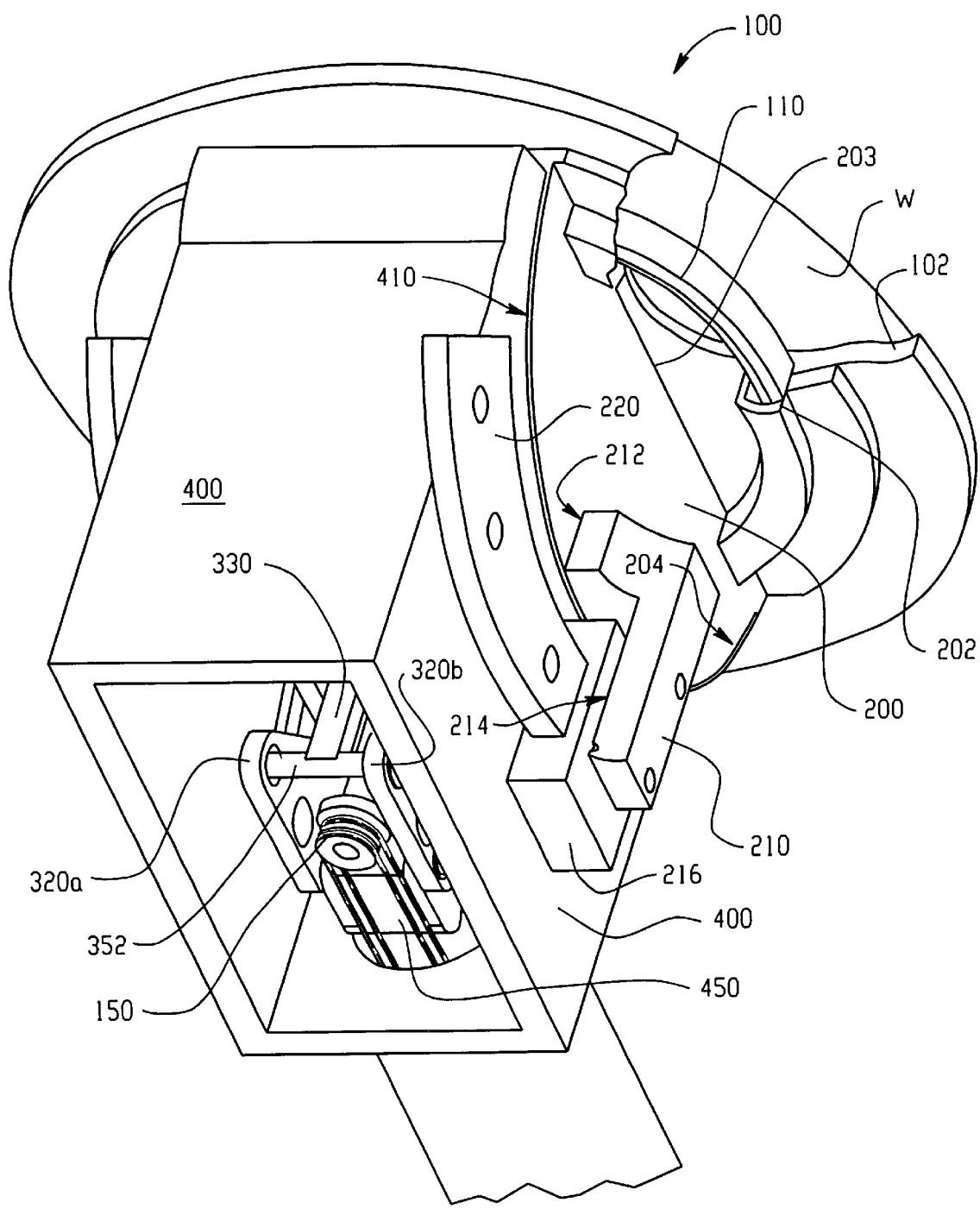
FIGS. 3A and 3B are rear perspective views of the wafer pad assembly of the invention, shown in an untilted position, with a portion of the housing removed for clarity in FIG. 3B.

As shown in FIG. 3A, one or more support arms 210 comprise a first end 212 mounted to the hemispherical frame 200 and a second end 214 mounted to a pillow block 216. The pillow block comprises an interior channel sized and shaped for slidably receiving a support rail 220. The support rail is mounted upon the housing 400 and is shaped to provide the same radius of curvature as the mating surfaces 204, 410. Thus, the support arms 210, pillow block 216 and support rail 220 function to join the hemispherical frame 200 to the housing 400 and to retain the outer convex surface 204 of the frame 200 in mating engagement with the concave surface 410 of housing 400 so that the hemispherical frame, and hence the wafer support pad 102 is pivotable about the X axis.

The portion of tilt/twist linkage system 300 responsible for tilt actuation is referred to herein as the "four bar" linkage system, and is designed to pivot or tilt the wafer at its geometric center about the X-axis. The four bar linkage system comprises a first and second pair of triangular members 310a,b, and 320a,b which operate in unison, an upper tilt arm 330, a pair of lower tilt arms 340a,b, and a pull bar 450 (see FIG. 4). Located between each pair of triangular members and between the upper and lower tilt arms is the portion of the tilt/twist linkage system 300 responsible for twist actuation, as previously described above.

Figure 3B:
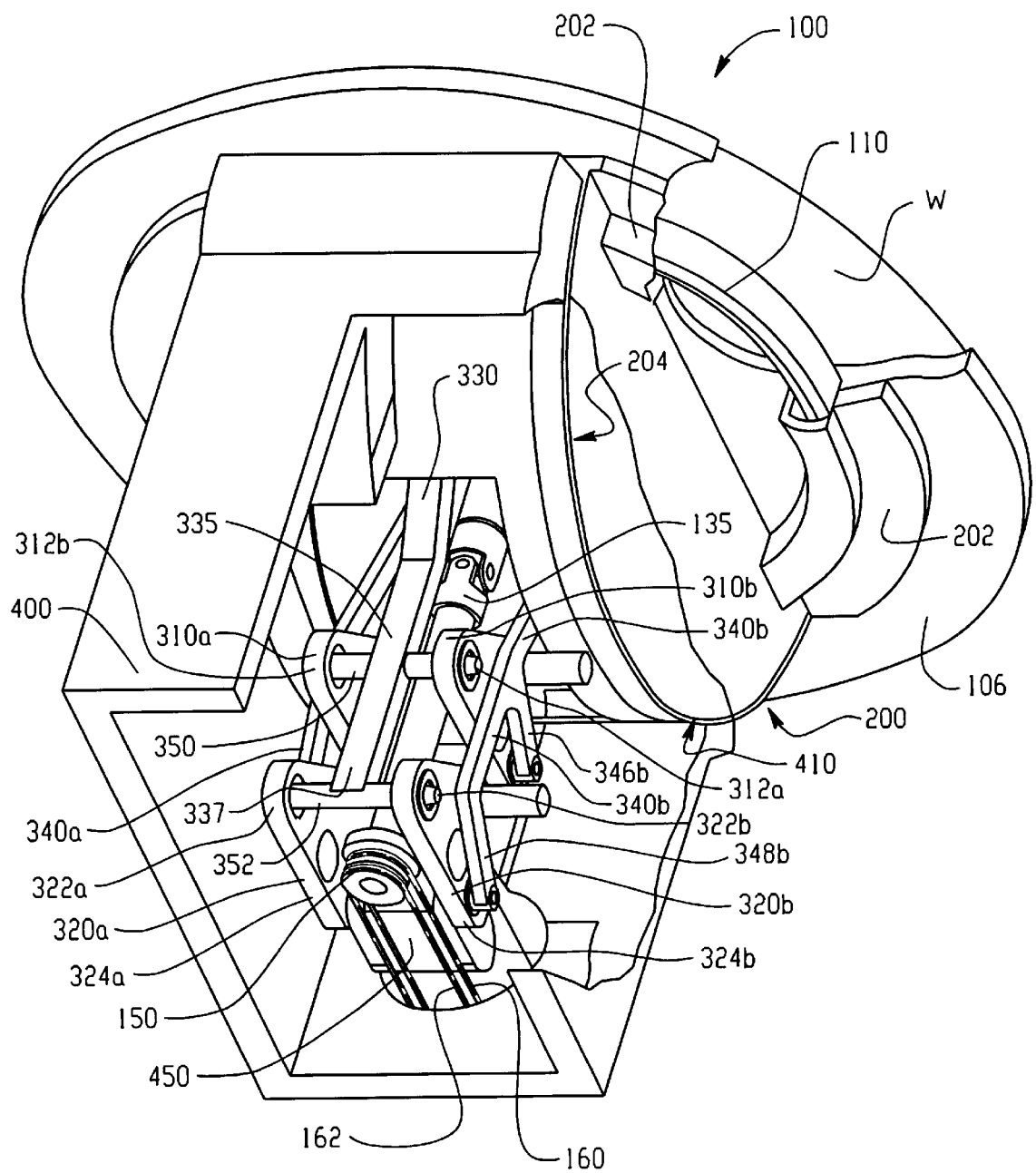

The upper tilt arm 330 has a first end 332 pivotally connected to a flange 334 mounted upon an inner surface 336 of the hemispherical frame 200. The upper tilt arm 330 has an elbow bend section 331 of about 160 degrees located near the first end 332 which functions to provide clearance for the rotation of the tilt linkage system. As shown in FIG. 3B, midsection 335 of the upper tilt arm 330 is connected to a first cross member 350 which joins the upper ends or vertices 312a,b of the first set of triangular members 310a,b. A second end 337 of the upper tilt arm 330 is connected to a second cross member 352 which joins the upper ends or vertices 322a,b of the second set of triangular members 320a,b.

Figure 4:
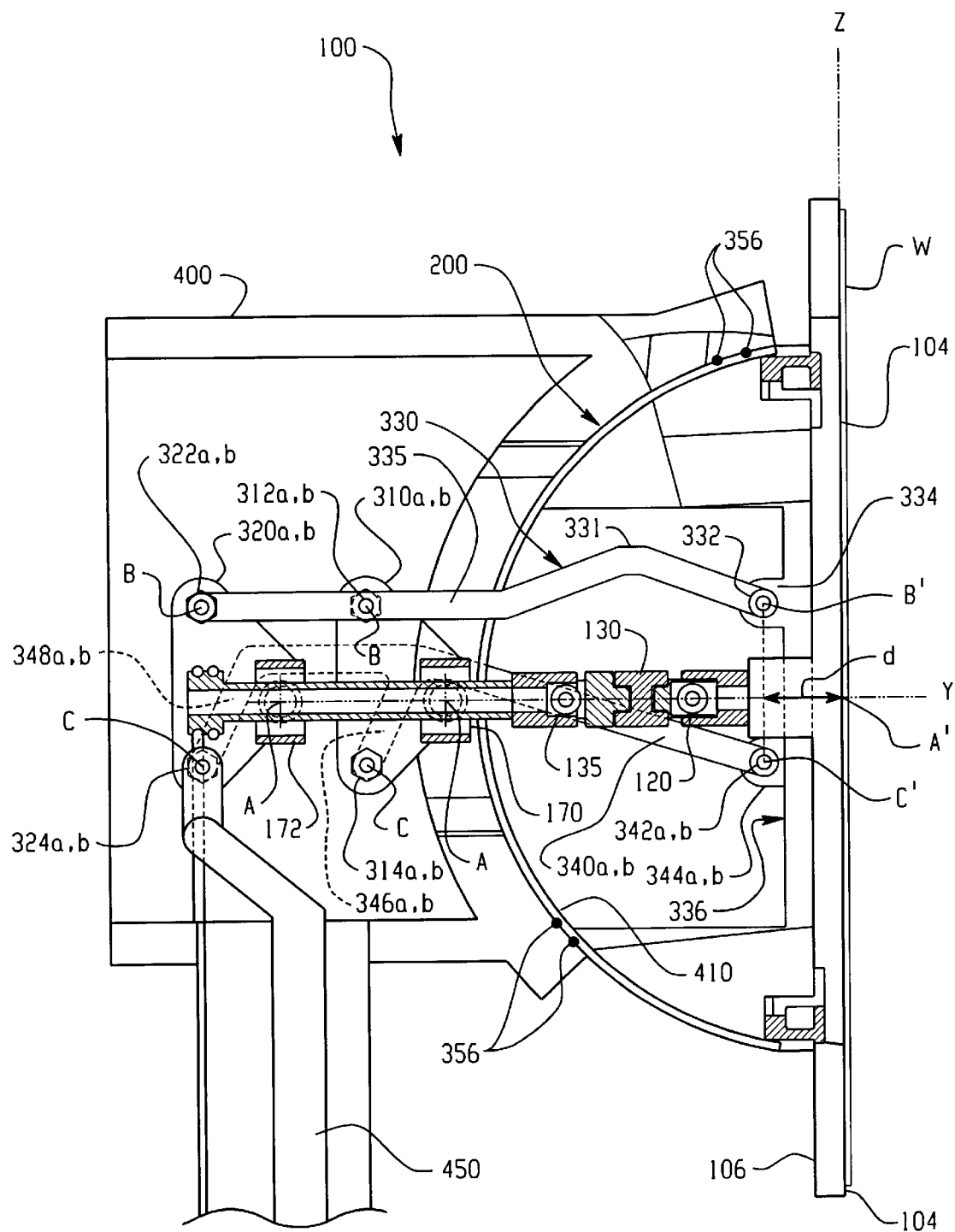
FIG. 4 is a cutaway sectional side view of the wafer pad assembly of the present invention shown in a untilted position.

As shown in FIG. 4, each of the lower tilt arms 340a,b of the four bar linkage system has a first end 342a,b mounted to a flange 344a,b on the inner surface 336 of the hemispherical frame 200. A second end of each of the lower tilt arms 340a,b comprises a forked end 346a,b and 348a,b. Forked end 346a,b is joined to a lower end 314a,b of the first set of triangular members 310a,b. Forked end 348a,b is joined to a lower end 324a,b of the second set of triangular members 320a,b.

Each of the triangular members 310a,b and 320a,b has the same geometric shape with vertices on each denoted on FIG. 4 as "A", "B" and "C". Each triangular member pivots or rotates about the vertex designated as "A". The connection of the upper tilt arm 330 to the flange 334 on the hemispherical frame 200 (denoted as 'B'"), the connection of the lower tilt arms 340a,b to the flanges 344a,b on the hemispherical frame 200 (denoted as 'C'" in FIG. 4), and the geometric center of the wafer W (denoted as 'A'" in FIG. 4) form the same geometric relationship as the triangular members 310a,b and 320a,b. The point A' is coincident with the intersection of the X, Y and Z axes in FIG. 2.

In addition, the rotational pivot point A of each of the triangular members 310a,b and 320a,b is preferably co-linear with the geometric center A' of the wafer. Further, the pivot points B and C of each of the triangular members 310a,b and 320a,b are preferably co-linear with the pivot points B' and C' of the wafer support pad 102. It is also important to note that the linkage system is preferably designed with the offset distance "d", which functions to pivot the wafer W about its geometric center A'. The offset distance "d" is defined as the perpendicular distance from the line defined by vector B'C' to the pivot point A'. Without the offset distance "d", each of the triangular members would pivot about its respective geometric center, which would result in the wafer being pivoted about some point behind its geometric center.

The four bar linkage system actuator is pull bar 450, which interconnects the lower ends of triangular members 320a,b. Actuation of pull bar 450 causes rotation of the triangular members 310a,b and 320a,b about their respective pivot points A. As each of the triangular members 310a,b and 320a,b rotates, upper tilt arm 330 and lower tilt arms 340 work in tandem to rotate the hemispherical frame 200, and thus the wafer W, about point A'.

It is also important to note that the tilt/twist linkage system 300 is enclosed within the hemispherical frame 200 and the housing 400, which operate under atmospheric conditions. However, the wafer W is placed in a high vacuum environment, typically on the order of 1.0e–7 torr. Therefore, differentially pumped seals 356 are provided at the interface of convex-shaped surface 204 of hemispherical frame 200 and concave-shaped surface 410 of housing 400.

While the invention has been shown and described with respect to specific embodiments thereof, this is for the purpose of illustration rather than limitation, and other variations and modifications of the specific embodiments herein shown and described will be apparent to those skilled in the art within the intended spirit and scope of the invention as set forth in the appended claims.

We claim:

1. A batch ion implanter comprising, a rotating disk having a plurality of wafer pad assemblies positioned about the periphery thereof, each of the plurality of wafer pad assemblies further comprising:
   a frame;
   a wafer support pad having an upper surface for mounting a wafer and a lower surface rotationally mounted to said frame;
   said lower surface of said wafer support pad further comprising a flange connected to a rotatable shaft; said shaft being connected to an actuator for selectively rotating said shaft wherein said wafer support pad is rotationally indexed.

2. The wafer pad assembly of claim 1 wherein said wafer support pad is rotated about its geometric center.

3. The wafer pad assembly of claim 1 wherein said upper surface of the wafer support pad is operable under vacuum conditions and said lower surface of the wafer support pad is operable under atmospheric conditions.

4. The wafer pad assembly of claim 1 wherein said flange is connected to said shaft via a universal joint.

5. The wafer pad assembly of claim 1 wherein said shaft further comprises a telescopic section to accommodate tilting of said wafer support pad.

6. The wafer pad assembly of claim 1 wherein said lower surface of said wafer support pad further comprises a circumferential bearing which permits rotation of the wafer support pad.

7. The wafer pad assembly of claim 5 wherein the lower surface of said wafer support pad has an outer curved surface being rotatably mounted within a correspondingly curved mating bearing surface of a housing; and wherein said outer curved surface is connected to a plurality of linkages for rotating the wafer support pad within the curved frame.

8. The wafer pad assembly of claim 1 wherein the wafer support pad is rotatable about its center in a range of about 0 to about 270 degrees.

9. The wafer pad assembly of claim 1, wherein said actuator includes a pulley and a pair of push/pull cables.

10. A batch ion implanter comprising, a rotating disk having a plurality of wafer pad assemblies positioned about the periphery thereof, each of the plurality of wafer pad assemblies further comprising:
    a wafer support pad having an upper surface for mounting a wafer and a lower surface, said lower surface being connected to an inner surface of a frame;
    said frame further comprising an outer curved surface being rotatably mounted within a mating bearing surface of a housing;
    said frame being connected to a plurality of linkages for rotating the frame within the housing.

11. The wafer pad assembly of claim 10 wherein said frame further comprises an upper and lower flange, said upper flange being connected to a first end of a first linkage, and a second end of said first linkage being connected to a first end of a second linkage pivotally mounted to the housing, a second end of said second linkage being connected to a first end of a third linkage, and a second end of said third linkage being connected to said lower flange.

12. The wafer pad assembly of claim 10 wherein said wafer support pad further comprises a lower surface rotationally mounted to the frame of the wafer pad assembly;

said lower surface of said wafer support pad further comprising a flange connected to a rotatable shaft; said shaft being connected to an actuator for selectively rotating said shaft wherein said wafer support pad is rotationally indexed.

13. The wafer pad assembly of claim 10 wherein said wafer support pad is tiltable about its center in the range of about 0 to about +/−35 degrees.

* * * * *